(12) United States Patent
Chang et al.

(10) Patent No.: US 7,588,881 B2
(45) Date of Patent: Sep. 15, 2009

(54) METHOD OF MAKING THIN FILM TRANSISTOR LIQUID CRYSTAL DISPLAY

(75) Inventors: Chin-Shan Chang, Changhua County (TW); Wen-Chun Wang, Taichung (TW); Fa-Chen Wu, Taichung (TW)

(73) Assignee: Wintek Corporation, Taichung (TW)

( * ) Notice: Subject to any disclaimer, the term of this patent is extended or adjusted under 35 U.S.C. 154(b) by 592 days.

(21) Appl. No.: 11/404,861

(22) Filed: Apr. 17, 2006

(65) Prior Publication Data
US 2007/0105052 A1 May 10, 2007

(51) Int. Cl.
*H01L 21/00* (2006.01)
*G01F 7/00* (2006.01)
(52) U.S. Cl. .................. 430/311; 430/313; 430/320; 430/319; 438/151
(58) Field of Classification Search .......... 430/311, 430/313, 320, 394; 438/151
See application file for complete search history.

(56) References Cited

U.S. PATENT DOCUMENTS 6,913,957 B2 * 7/2005 Yang .................. 438/151

* cited by examiner

*Primary Examiner*—Thorl Chea
(74) *Attorney, Agent, or Firm*—Bacon & Thomas, PLLC

(57) ABSTRACT

A thin film transistor liquid array substrate includes forming a plurality of amorphous silicon thin film transistors and storage capacities on a transparent substrate, wherein the amorphous silicon thin film transistors and the storage capacities are arranged in an array pattern. The storage capacitor has a top electrode and a bottom electrode, which are made of transparent conductive material to increase aperture ratio. A method of making the amorphous silicon thin film transistors and the storage capacities includes four photomask processes and a back exposure technique. Because the present invention only uses four photomask processes, the number of photomasks used in the process of the present invention is less than the conventional method, and the cost of fabrication is lower also.

7 Claims, 6 Drawing Sheets

METHOD OF MAKING THIN FILM TRANSISTOR LIQUID CRYSTAL DISPLAY

BACKGROUND OF THE INVENTION

1. Field of the Invention

The present invention relates generally to a thin film transistor liquid crystal display (TFT-LCD), and more particularly to a method of making a thin film transistor liquid crystal display fabricated through four photomask processes.

2. Description of the Related Art

A conventional thin film transistor liquid crystal display primarily includes a thin film transistor (TFT) array substrate, a color filter and a liquid crystal layer, wherein the TFT array substrate includes a transparent substrate with a plurality of scan lines and data lines. These scan lines and data lines are perpendicular to define a plurality of subpixels. In each subpixel, there is a thin film transistor, a storage capacitor and a pixel electrode. The thin film transistor is used to be a switch member of the liquid crystal display, which includes a gate, a gate insulating layer, a channel layer, an ohmic contact layer, a source/drain, a passivation layer and a pixel electrode layer. It needs five or six photomasks to make above structure layers in the conventional process of making the thin film transistor liquid crystal display.

For a process using five photomasks, the first photomask process is used to define a first metal layer to form the scan lines and the gate of the thin film transistor. The second photomask process is used to define the channel layer and the ohmic contact layer of the thin film transistor. The third photomask process is used to define a second metal layer to form the source/drain of the thin film transistor and the data lines. The fourth photomask process is used to pattern a passivation layer to form a via. The fifth photomask process is used to pattern a transparent conductive layer to form the pixel electrode. However, the more photomasks used in the process take the higher cost for the process and cannot simplify the process.

In additional, the conventional storage capacitor is formed by use of the patterned first metal layer as the bottom electrode and overlapped by the second metal layer as the top electrode. Due to the metal layer is opaque, the areas of storage capacitors in the subpixels are not pervious to light so that the aperture ratio is reduced.

SUMMARY OF THE INVENTION

The primary objective of the present invention is to provide a method of making a thin film transistor array substrate, which the number of photomasks used in the process is reduced to lower the manufacture cost.

The secondary objective of the present invention is to provide a method of making a thin film transistor liquid crystal display, which increases the aperture ratio.

To achieve the objectives of the present invention, a method of making a thin film transistor liquid crystal display comprises the steps of:

Providing a substrate with a double-layer film on a surface thereof, wherein the double-layer film includes a first transparent conductive layer on the surface of the substrate and a first metal layer on the first transparent conductive layer.

Performing a first photomask process including using a gray-scale photomask to define the double-layer film with a gate, a scan line and a bottom electrode of a storage capacitor. The first transparent conductive layer and the first metal layer construct the gate and the scan line. The first transparent conductive layer only constructs the bottom electrode of the storage capacitor.

Forming a gate insulating layer, a first semiconductor layer and a second semiconductor layer are deposited in sequence to cover the substrate, the gate, the scan line and the bottom electrode of the storage capacitor. By a back exposure of the substrate, the patterned first metal layer is used to be a photomask of the back exposure to define a channel layer and an ohmic contact layer on the first semiconductor layer and the second semiconductor layer.

Forming a second metal layer to cover the gate insulating layer, the channel layer and the ohmic contact layer. Performing a second photomask process to pattern the second metal layer in order to define a source/drain and a data line and break the ohmic contact layer between the source and the drain.

Forming a passivation layer to cover the substrate, the source/drain and the bottom electrode of the storage capacitor. Performing a third photomask process to make at least a via on the passivation layer.

Forming a second transparent conductive layer to cover the passivation layer and fill the via to electrically connect the drain; and performing a fourth photomask process to define a patterned pixel electrode on the second transparent conductive layer.

DETAILED DESCRIPTION OF THE INVENTION

Figure 1:
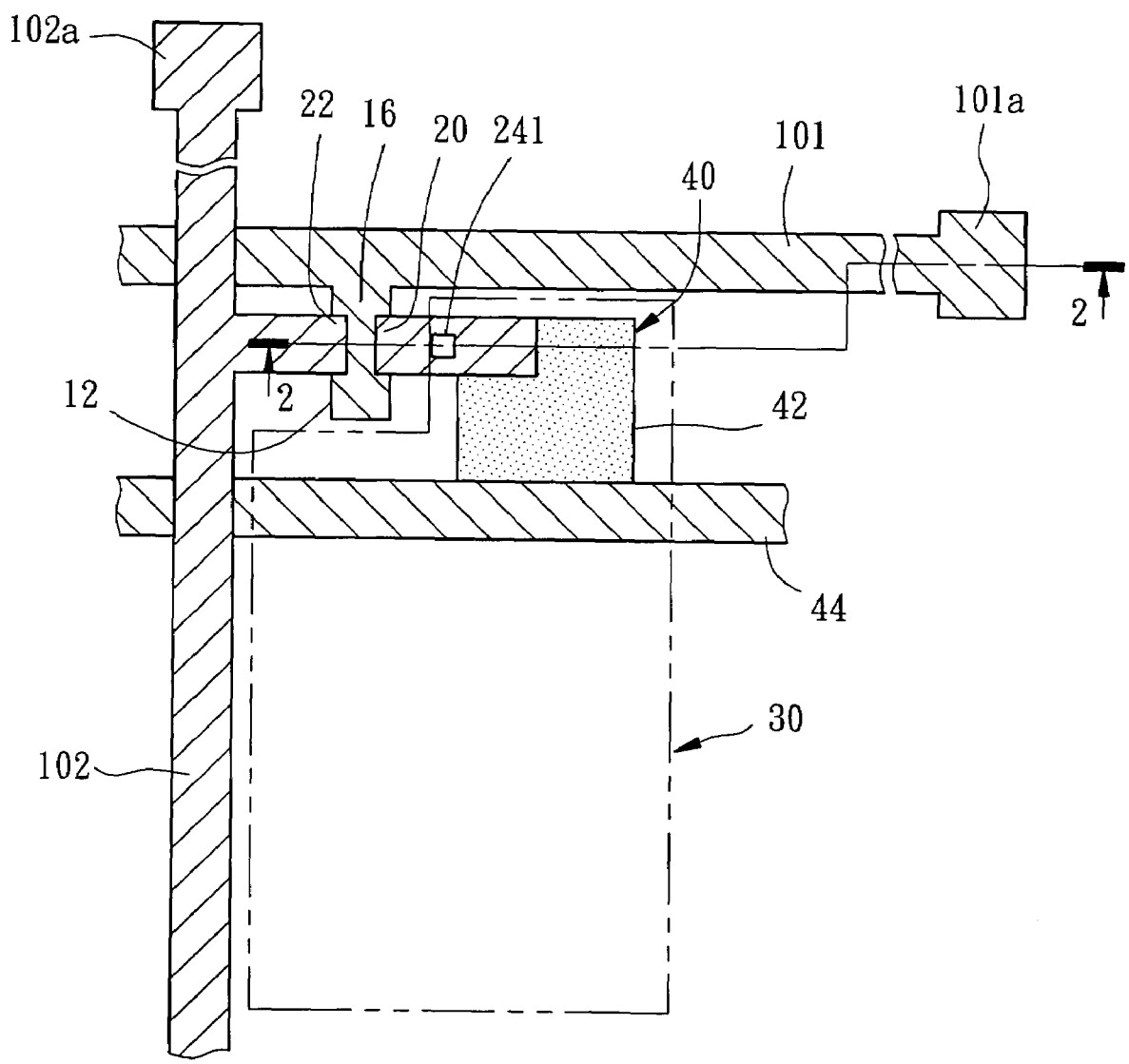
FIG. 1 is a top view of the thin film transistor liquid array panel of a preferred embodiment of the present invention.
Figure 2:
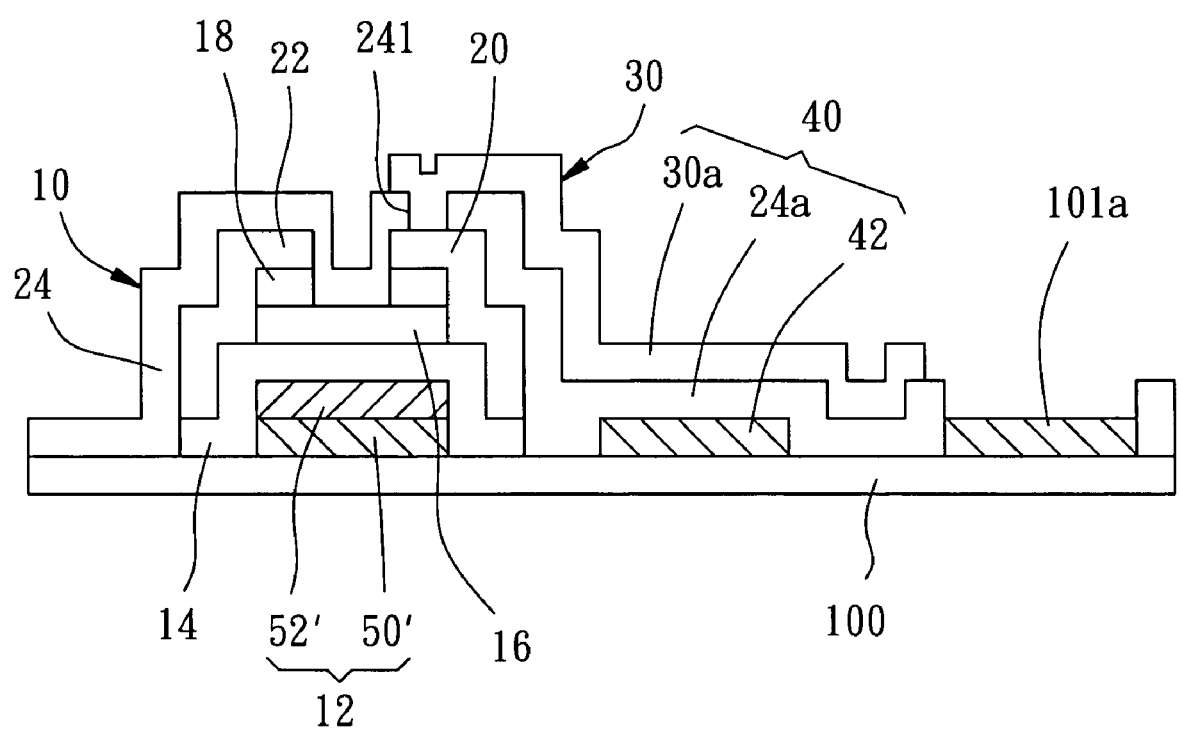
FIG. 2 is a sectional view along 2-2 line of FIG. 1.

As shown in FIGS. 1 and 2, a thin film transistor array substrate of the preferred embodiment of the present invention includes a transparent substrate 100 with a plurality of scan lines 101 and data lines 102 thereon. The scan lines 101 and the data lines 102 are perpendicular and cross to each other to form a plurality of subpixels therebetween. The scan lines 101 have a first terminal portion 101a at an end thereof, and the data lines 102 have a second terminal portion 102a at an end thereof. The first terminal portion 101a and the second terminal portion 102a are electrically connected to a driving circuit. Each of the subpixels have an amorphous silicon thin film transistor (a-Si TFT) 10, a pixel electrode 30 and a storage capacitor (Cst) 40. These components are described hereunder:

The a-Si TFT 10 is an island-like structure with layers (from a bottom to a top) including a gate 12, a gate insulating layer 14, a channel layer 16, an ohmic contact layer 18, a source 22/drain 20 and a passivation layer 24. The gate 12 is formed at a portion of the scan lines 101 and electrically connected to the scan lines 101. In the present embodiment, the gate 12 and the scan lines 101 are made of a transparent conductive material and a metal material that are stacked. The process will be described later. The passivation layer 24 form a via.

The pixel electrode 30 covers the passivation layer 24 and is electrically connected to the drain 20 through the via 241.

The storage capacitor 40 is near to the a-Si TFT 10, which includes a bottom electrode 42 on a surface of the substrate 100, a pixel electrode 30a formed above the bottom electrode 42 and a passivation layer 24a between the bottom electrode 42 and the pixel electrode 30a. The pixel electrode 30a will be a top electrode of the storage capacitor 40, and the passivation layer 24a will be a dielectric layer of the storage capacitor 40.

Above is the structure of the amorphous silicon thin film transistor 10 and the storage capacitor 40 of the present invention, and the method of making the structure will be described hereunder including four photomask processes and a back exposure process.

Figure 3A:
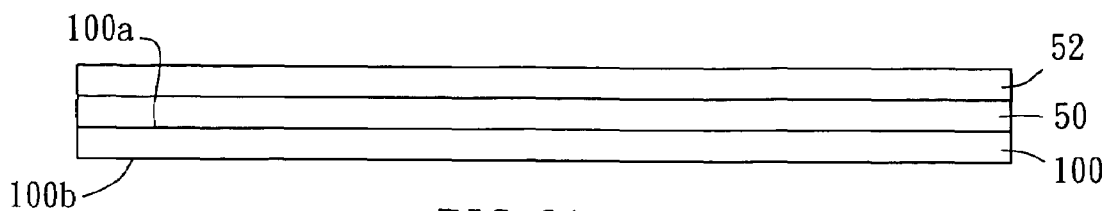
FIG. 3A to FIG. 3E are the sectional views of the preferred embodiment of the present invention, showing the first photomask process.

As shown in FIG. 3A, preparing the substrate 100, on a surface 100a of which a first transparent conductive layer 50, which is made of indium tin oxide (ITO), is pre-provided. And then, form an opaque first metal layer 52 on a surface of the first transparent conductive layer 50. The first transparent conductive layer 50 and the first metal layer 52 construct a double-film structure.

Figure 3B:
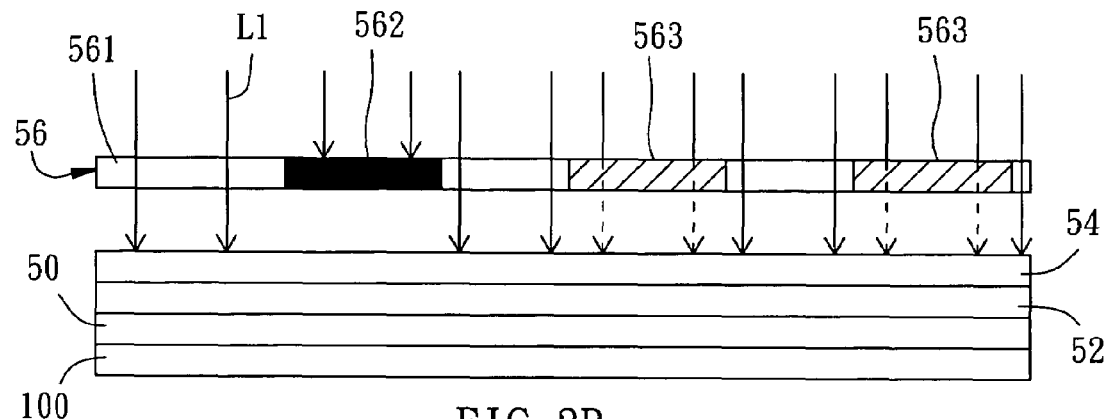
Figure 3C:
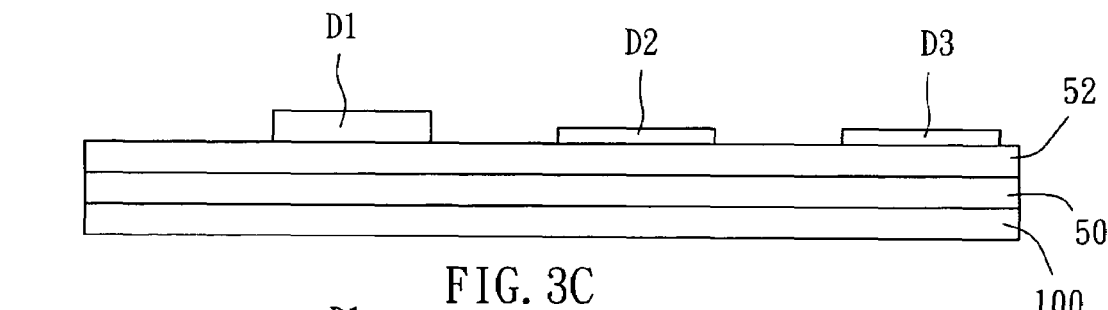
Figure 3D:
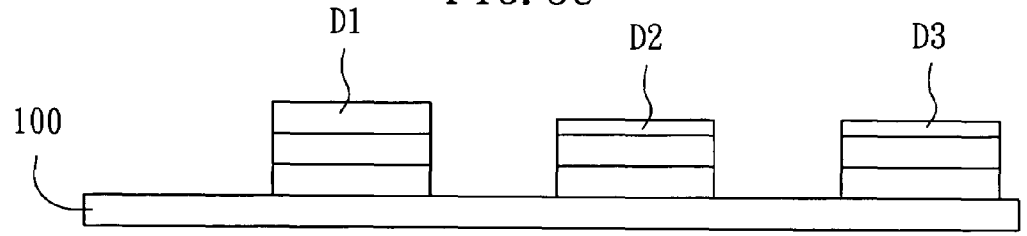

FIG. 3B to FIG. 3D show the first photomask process, which includes:

Coating a photoresist layer 54 on a surface of the first metal layer 52.

Placing a gray-scale photomask 56 on the photoresist layer 54, where the gray-scale photomask 56 has a transparent region 561, an opaque region 562 and a semi-transparent region 563.

Exposing the gray-scale photomask 56 under rays L1. Due to the different optical characters on different regions of the gray-scale photomask 56, when the rays L1 irradiates to the photoresist layer 54 through the transparent region 561 and the semi-transparent region 563, the region of the photoresist layer 54 under the transparent region 561 of the gray-scale photomask 56 takes stronger ray intensity than the region under the semi-transparent region 563. The region of the photoresist layer 54 taken stronger ray intensity will be dissolved faster in the development process.

Then, developing the photoresist layer 54 to dissolve the regions thereof exposed by the rays. The region of the photoresist layer 54 under the transparent region 561 will be totally dissolved. The region under the opaque region 562 will be remained and defined as a block D1. The region under the semi-transparent region 563 will be partly dissolved, and the remained part is defined as blocks D2 and D3. As shown in FIG. 3C, the block D1 is thicker than the block D2 and D3.

Figure 3E:
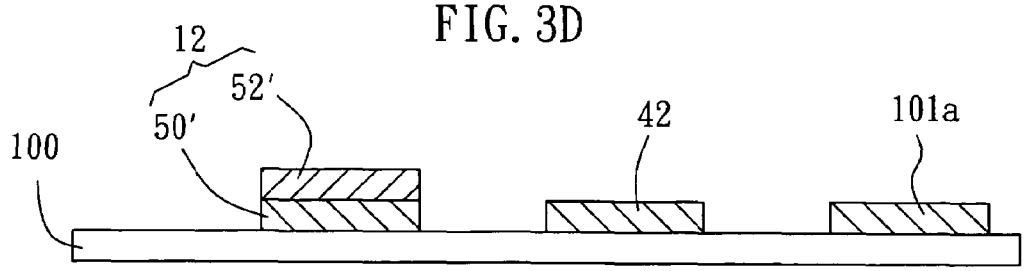

Performing the etching process on the first transparent conductive layer 50 and the first metal layer 52 to remove the part thereof unshielded by the blocks D1, D2 and D3. FIG. 3D shows the structure after the etching process. And then, the blocks D1, D2 and D3 are performed by the etching. Due to the thickness of the blocks D1, D2 and D3 are different; the depths of etching are different as well. The patterned structure after etching is shown in FIG. 3E. The patterned first metal layer 52' and the patterned first transparent conductive layer 50' associated with the block D1 construct the gate 12 and the scan line 101, and construct a common electrode 44 (referring to FIG. 1). The patterned first transparent conductive layer 50' associated with the block D2 construct the bottom electrode 42, and the patterned first transparent conductive layer 50' associated with the block D3 form the first terminal portion 101a.

Figure 4A:
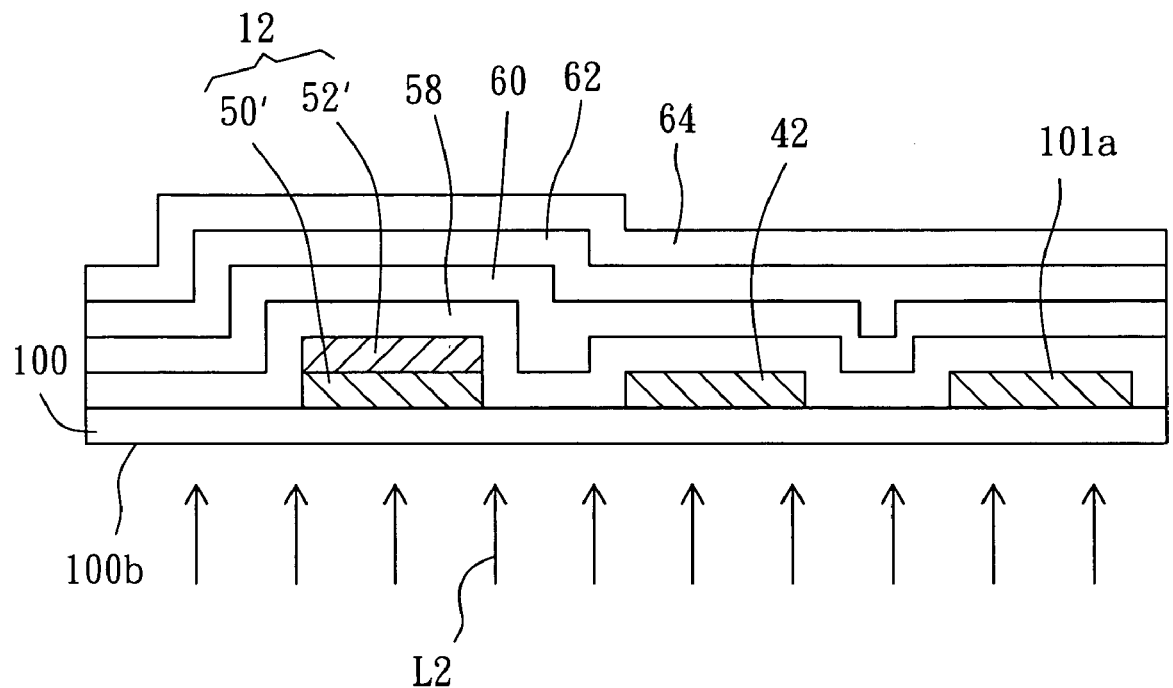
FIG. 4A and FIG. 4B are sectional views, showing the definition of the channel layer and the ohmic contact layer by the back exposure method of the preferred embodiment of the present invention.
Figure 4B:
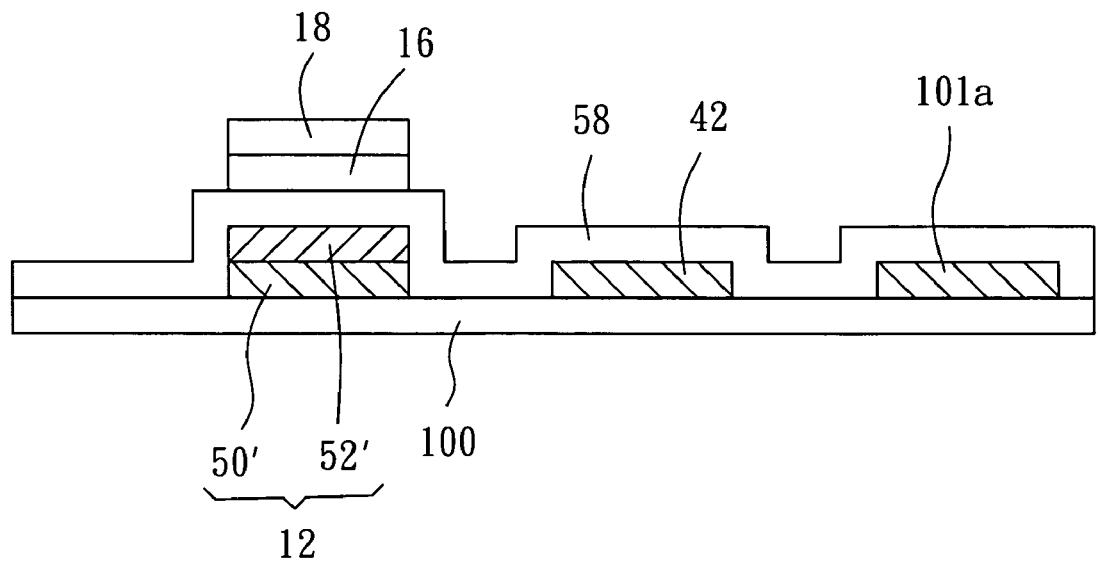

FIGS. 4A and 4B show the step of forming an insulating layer 58, a first semiconductor layer 60, a second semiconductor layer 62 and a photoresist layer 64 in sequence on the structure shown in FIG. 3E. The first semiconductor layer 60 is made of amorphous silicon (a-Si), and the second semiconductor layer 62 is made of amorphous silicon doped with n+ ions, and the photoresist layer 64 is positive photoresist. And then, exposing a bottom 100b of the substrate 100 under rays L2. Because the patterned first metal layer 52', which constructs the gate 12, is opaque, the region of the photoresist layer 64 shielded by the first metal layer 52' will not be dissolved by the developer in the following step. As a result, in the following steps of development, removing photoresist and etching, it will defines the channel layer 16 and the ohmic contact layer 18 on the insulating layer 58.

Figure 5A:
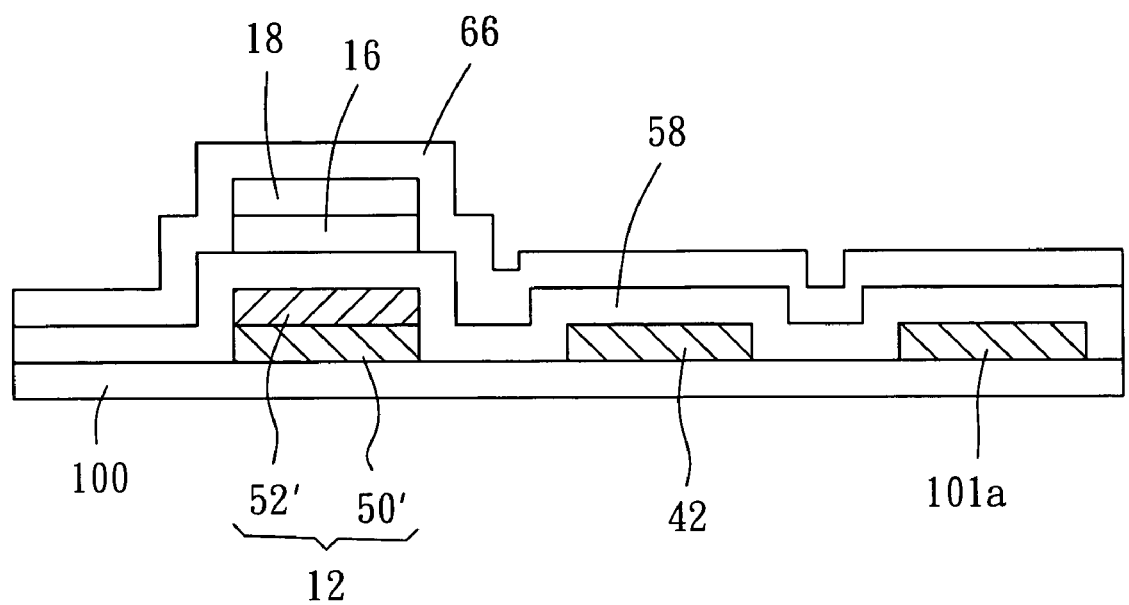
FIG. 5A and FIG. 5B are sectional views, showing the definition of the source/drain by the method of the preferred embodiment of the present invention.
Figure 5B:
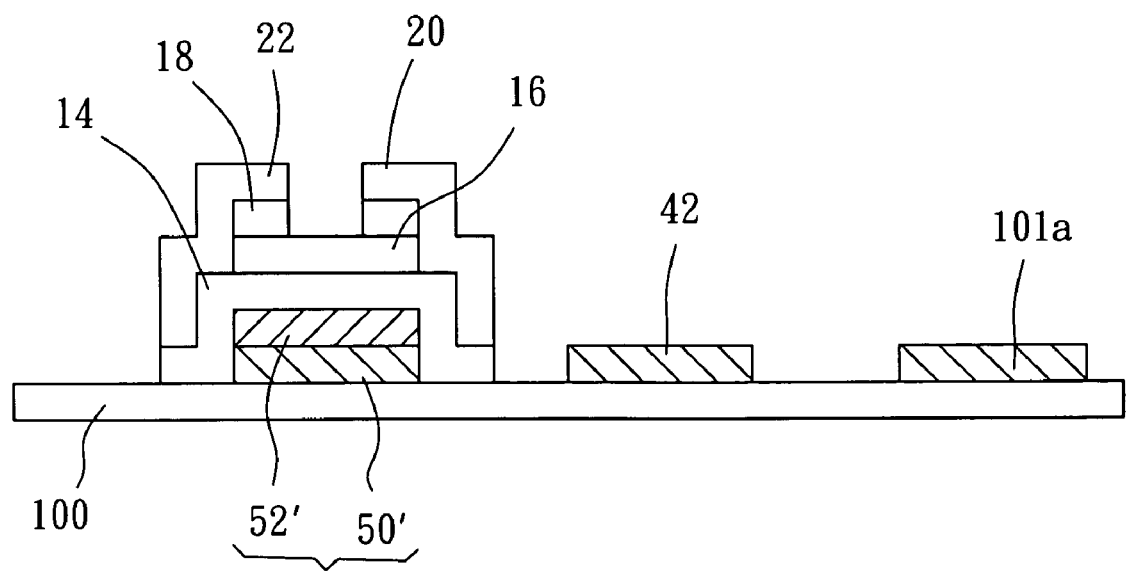

FIG. 5A shows the steps of forming a second metal layer 66 to cover the insulating layer 58, the channel layer 16 and the ohmic contact layer 18. FIG. 5B further shows the second photomask process, which includes the steps of coating photoresist, using a common binary photomask, exposure, development and etching, to pattern the second metal layer 66 for the source 22/drain 20 and the data line 102. This step also breaks the ohmic contact layer 18 between the source 22 and the drain 20 and keeps part of the insulating layer 58 to form the gate insulating layer 14 of the a-Si TFT 10 and to expose the bottom electrode 42 and the first terminal portion 101a.

Figure 6:
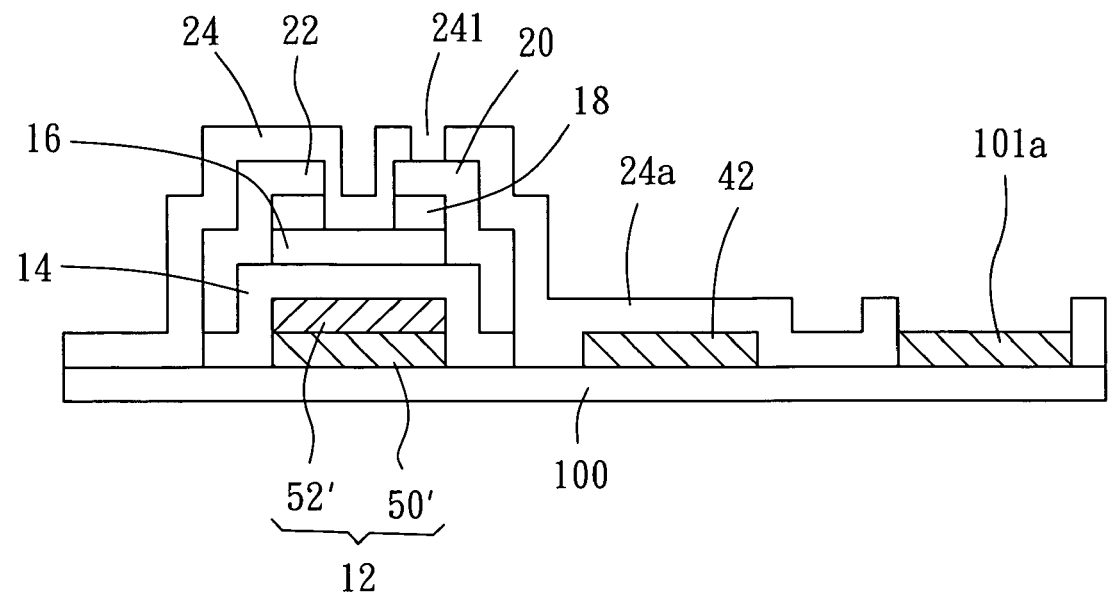
FIG. 6 is a sectional view, showing the definition of the passivation layer by the method of the preferred embodiment of the present invention.

FIG. 6 shows the step of forming an insulating layer (not shown) on the structure shown in FIG. 5B, and then performing the third photomask process to make the a-Si TFT 10 having the passivation layer 24 with the via 241. The passivation layer 24a above the bottom electrode 42 is used to be the dielectric layer of the storage capacitor 40. The third photomask process also makes the first terminal portion 101a exposing. The third photomask process includes the step of coating photoresist, using a common binary photomask, exposure, development and etching.

Figure 7:
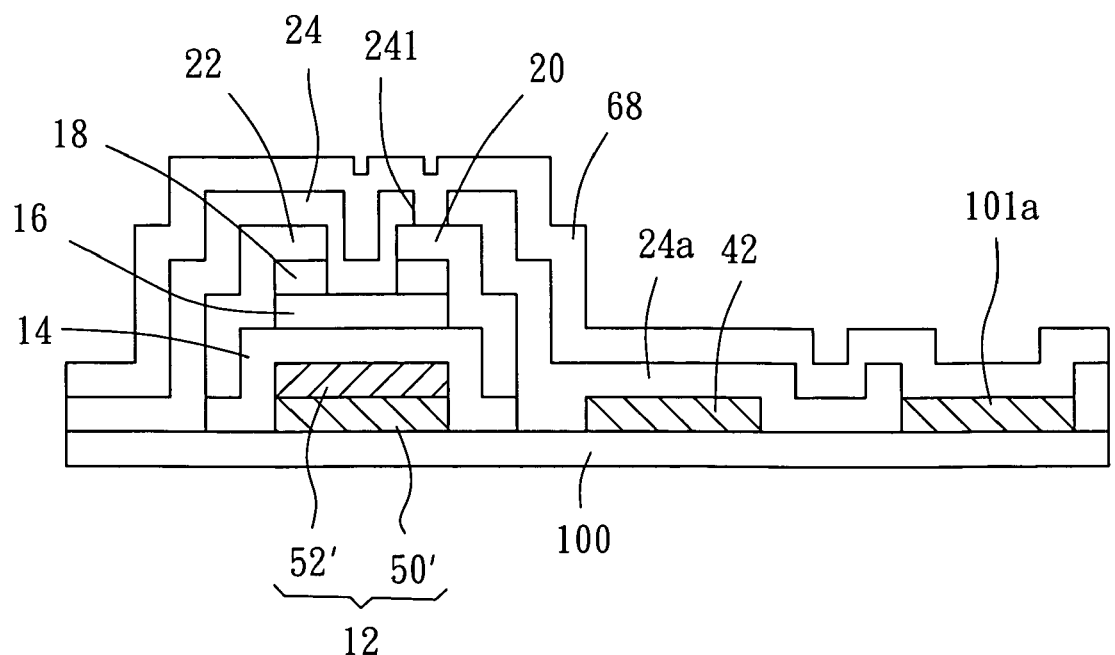
FIG. 7 is a sectional view of the preferred embodiment of the present invention, showing the second transparent conductive layer formed on the passivation layer.

FIG. 7 shows the step of forming a second transparent conductive layer 68 on the structure shown in FIG. 6. The second transparent conductive layer 68 is electrically connected to the drain 20 by the via 241. Next, the second transparent conductive layer 68 is patterned and formed a pixel electrode 30 through the fourth photomask process. The pixel electrode 30 above the bottom electrode 42 will be the top electrode of the storage capacitor 40. The fourth photomask process also includes the step of coating photoresist, using a common binary photomask, exposure, development and etching. After that, the structure shown in FIGS. 1 and 2 is made.

It has to be mentioned that the first transparent conductive layer 50 and the second transparent conductive layer 68 may be made of ITO.

In conclusion, the present invention only uses four photomasks to fabricate the TFT array substrate of a-Si TFT LCD. It can lower the cost of fabrication. Also, the top and bottom electrodes of the storage capacitor 40 are made of transparent conductive material that could increase the aperture ratio.

What is claimed is:
1. A method of making a thin film transistor liquid array substrate, comprising the steps of:
   providing a substrate with a double-layer film on a surface thereof, wherein the double-layer film includes a first transparent conductive layer on the surface of the substrate and a first metal layer on the first transparent conductive layer;

performing a first photomask process, which includes the steps of using a gray-scale photomask to form a gate, a scan line and a bottom electrode of a storage capacitor, wherein the gate and the scan line are constructed by the first transparent conductive layer and the first metal layer, and the bottom electrode of the storage capacitor is constructed by the first transparent conductive layer;

forming a gate insulating layer, a first semiconductor layer and a second semiconductor layer in sequence to cover the substrate, the gate, the scan line and the bottom electrode of the storage capacitor;

exposing a bottom of the substrate under rays, wherein the patterned first metal layer is used to be a light shield to form a channel layer and an ohmic contact layer;

forming a second metal layer to cover the gate insulating layer, the channel layer and the ohmic contact layer;

performing a second photomask process to pattern the second metal layer in order to define a source/drain and a data line and break the ohmic contact layer between the source and the drain and expose the bottom electrode;

forming a passivation layer to cover the substrate, the source/drain and the bottom electrode of the storage capacitor;

performing a third photomask process to make at least a via on the passivation layer;

forming a second transparent conductive layer to cover the passivation layer and cover the via to electrically connect the drain; and performing a fourth photomask process to pattern the second transparent conductive layer and form a pixel electrode.

2. The method as defined in claim 1, further defining a terminal portion in the step of defining the gate and the scan line, wherein the terminal portion is electrically connected to the scan line.

3. The method as defined in claim 2, wherein the gray-scale photomask used in the first photomask process has a has a transparent region, an opaque region and a semi-transparent region, and the double-layer film forms the gate and the scan line under the opaque region and forms the bottom electrode of the storage capacitor under the semi-transparent region.

4. The method as defined in claim 3, wherein the first photomask process comprises the steps of:

forming a photoresist layer on the double-layer film;

disposing the gray-scale photomask on the photoresist layer;

exposing the photoresist layer under rays through the transparent region and the semi-transparent region of the gray-scale photomask, wherein portions of the photoresist layer under the transparent region take stronger ray intensity than that under the semi-transparent region;

providing a developer to the dissolve the portions of the photoresist layer under the transparent region and the semi-transparent region of the gray-scale photomask, wherein the photoresist layer forms a plurality of blocks, which are portions of the photoresist layer not dissolved by the developer, and thicknesses of the blocks under the opaque region are thicker than that of the blocks under the semi-transparent region performing an etching process to form the gate, the scan line, the bottom electrode and the terminal portion on the double-layer film.

5. The method as defined in claim 1, wherein the first semiconductor layer is made of amorphous silicon, and the second semiconductor layer is made of amorphous silicon doped with n+ ions.

6. The method as defined in claim 1, wherein the first transparent conductive layer is made of indium tin oxide or indium zinc oxide.

7. The method as defined in claim 1, wherein the second transparent conductive layer is made of indium tin oxide or indium zinc oxide.

* * * * *

UNITED STATES PATENT AND TRADEMARK OFFICE
CERTIFICATE OF CORRECTION

PATENT NO.       : 7,588,881 B2
APPLICATION NO.  : 11/404861
DATED            : September 15, 2009
INVENTOR(S)      : Chang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 743 days.

Signed and Sealed this

Twenty-first Day of September, 2010

David J. Kappos
*Director of the United States Patent and Trademark Office*